United States Patent [19]
Huang

[11] Patent Number: 5,872,467
[45] Date of Patent: Feb. 16, 1999

[54] DYNAMIC COMPARATOR WITH IMPROVED PRE-CHARGE/SET-UP TIME

[75] Inventor: Eddy C. Huang, San Jose, Calif.

[73] Assignee: Winbond Electronics Corporation, Hsin-Chu, Taiwan

[21] Appl. No.: 904,197

[22] Filed: Jul. 31, 1997

[51] Int. Cl.$^6$ .................................................... H03K 5/22
[52] U.S. Cl. .............................. 327/63; 327/64; 327/65; 340/146.2; 365/189.07
[58] Field of Search ................................ 365/49, 189.07; 327/63, 64, 65; 340/146.2

[56] References Cited

U.S. PATENT DOCUMENTS

| | | | |
|---|---|---|---|
| 5,617,348 | 4/1997 | Maguire | 365/49 |
| 5,694,362 | 12/1997 | Zhang et al. | 365/49 |
| 5,729,190 | 3/1998 | Iyengar et al. | 365/189.07 |
| 5,754,463 | 5/1998 | Henstrom et al. | 365/49 |
| 5,761,140 | 6/1998 | Choi | 365/201 |
| 5,764,089 | 6/1998 | Partovi et al. | 327/200 |

*Primary Examiner*—Toan Tran
*Attorney, Agent, or Firm*—Burns, Doane, Swecker & Mathis, L.L.P.

[57] ABSTRACT

A multiple bit dynamic comparator is described which includes logic gates that function to turn-off particular devices that are directly connected to the comparator output node and thereby isolate the output node from parasitic capacitances during a pre-charge/set-up phase. During the pre-charge/set-up phase, the output node is charged to VCC and the input signals to be compared are applied to the appropriate inputs of a plurality of comparison sub-circuits. The plurality of comparison subcircuits are coupled to the output node. Each device within the comparison sub-circuits that is directly connected to the output node of the dynamic comparator (i.e. top row of devices) has its gate coupled to a NOR gate. The inputs of the NOR gate are cross-coupled to input signals being compared such that when a match occurs between the inputs the NOR gates hold all top row devices off. As a result, the pre-charging of the output node during the pre-charge phase is unaffected by unwanted parasitic capacitances.

7 Claims, 3 Drawing Sheets

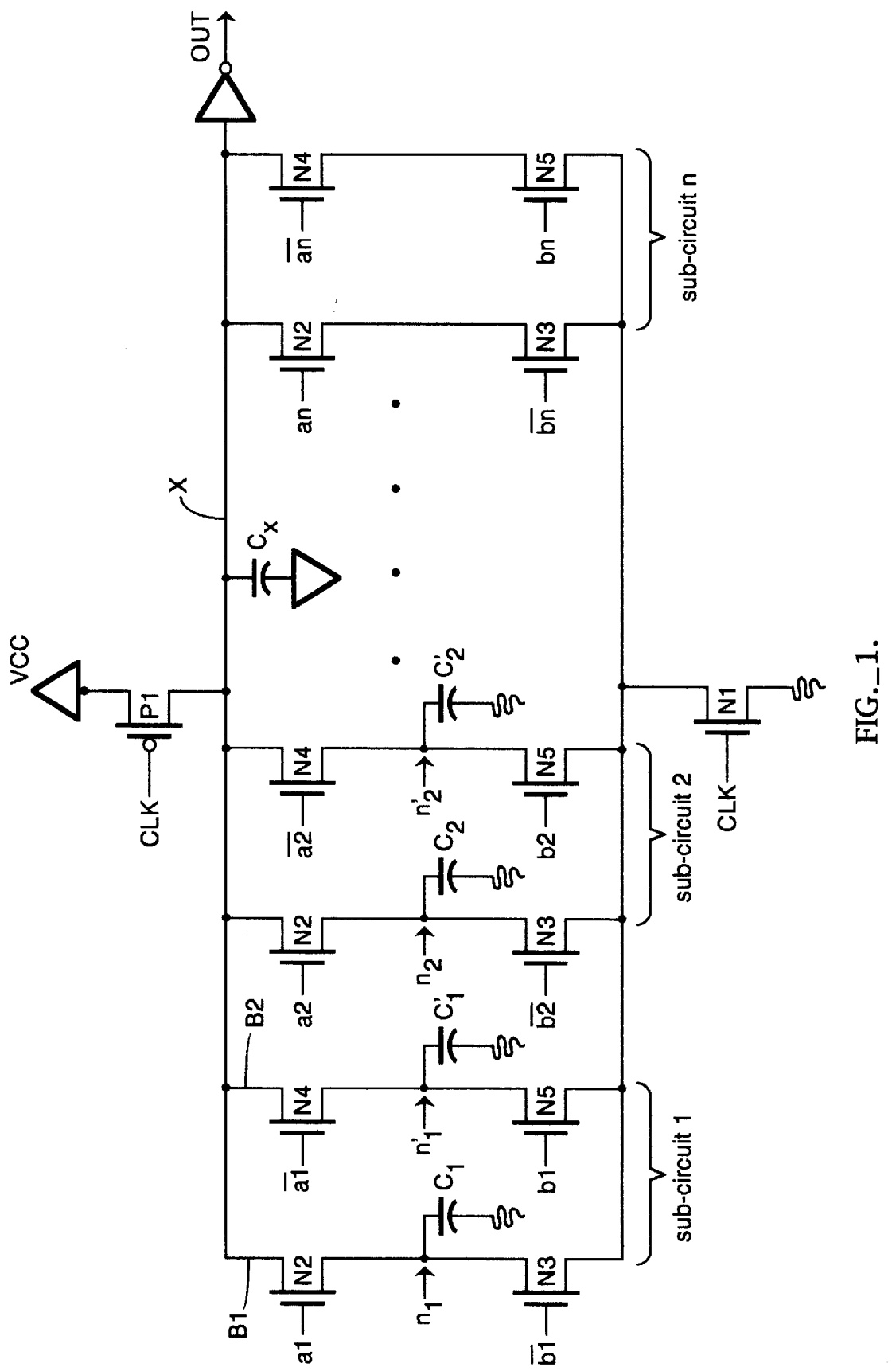
FIG._1.

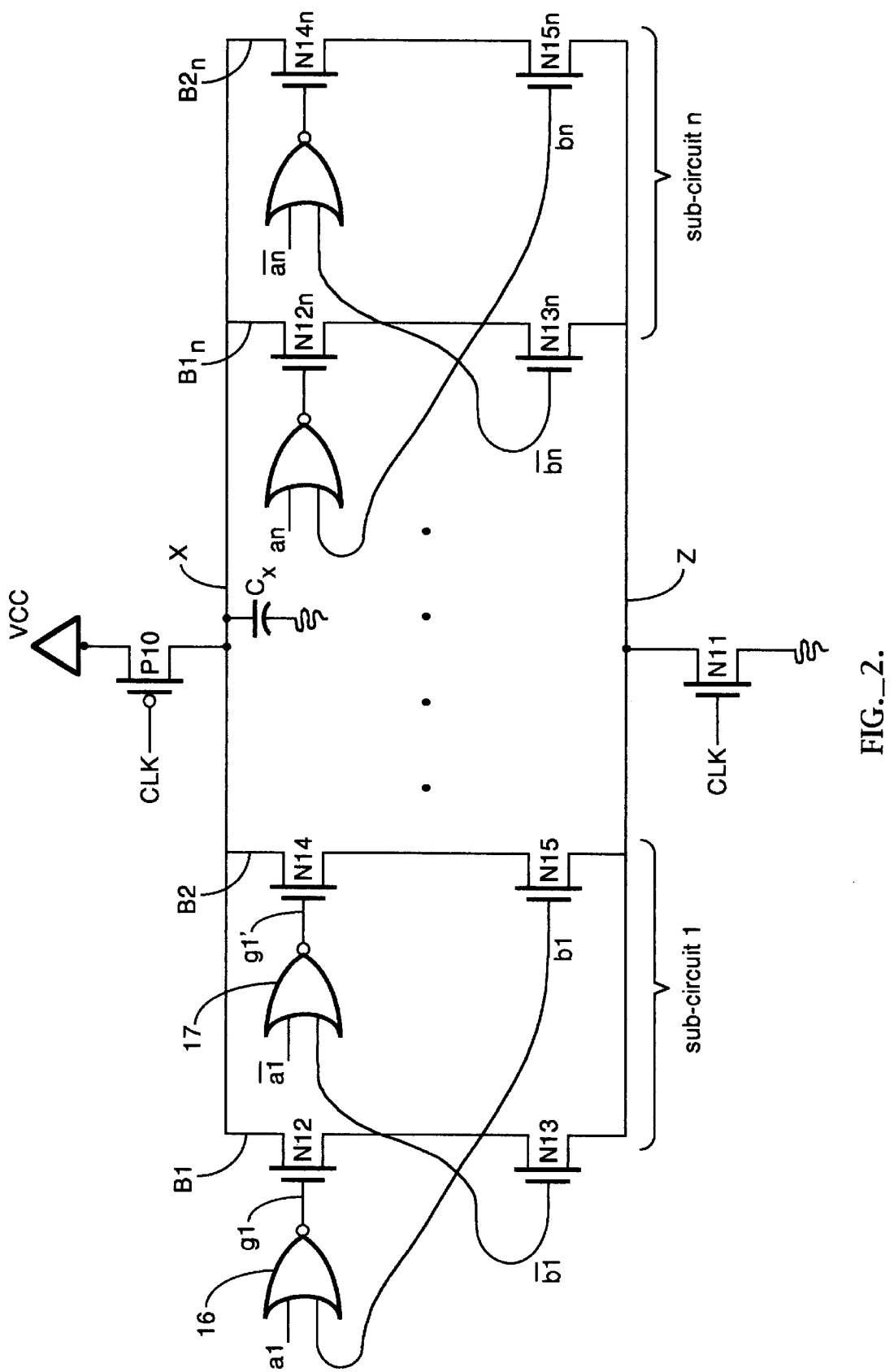
FIG._2.

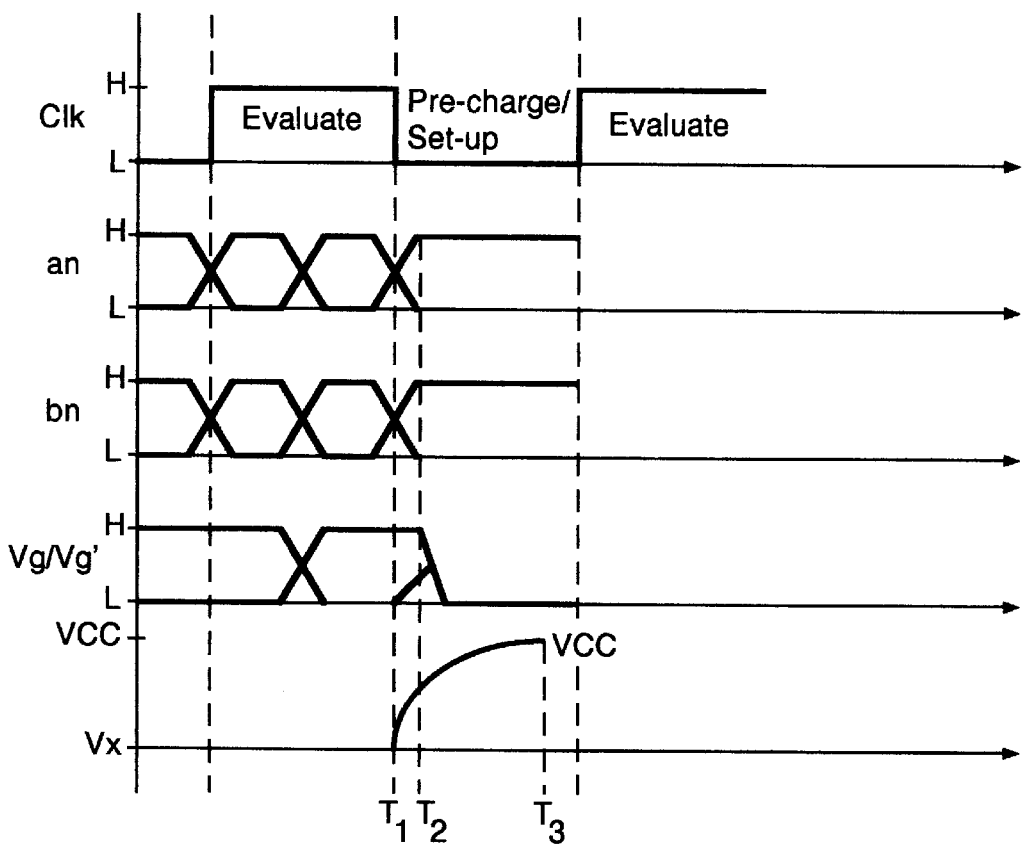
FIG._3.
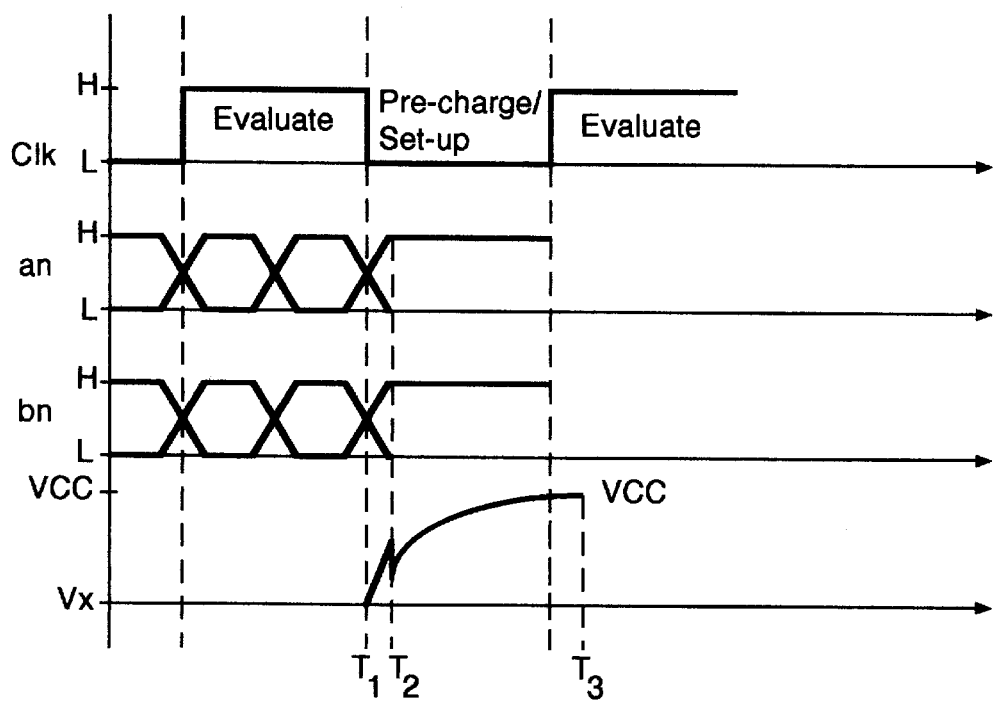
FIG._4.

DYNAMIC COMPARATOR WITH IMPROVED PRE-CHARGE/SET-UP TIME

BACKGROUND OF THE INVENTION

1. Field of the Invention

The present invention relates to comparators and particularly to multiple input dynamic comparators.

2. State of the Art

In the field of circuit design, comparators function to compare the voltage level of two digital signals and to output a signal indicating whether they are equal or not. A multiple input comparator is designed to perform a parallel bit-by-bit comparison of two multiple bit digital bus signals and to indicate whether the two buses are the same or different. In this case, bit lines from each bus are paired and compared and if any of the bits of the two buses are different, the comparator outputs a signal that indicates that the two bus signals are not the same.

A dynamic comparator is a clocked comparator that pre-charges its output to a known state in a first pre-charge clock phase and performs the comparison in a second evaluate clock phase. FIG. 1 shows a prior art dynamic comparator which compares bit line signals $a_1$–$a_n$ of a bus A to bit line signals $b_1$–$b_n$ of a bus B. As shown, the comparator includes two devices P1 and N1 having opposite polarity and controlled by a clock signal CLK such that during a pre-charge phase (e.g. CLK=LOW), P1 is on and node X is pre-charged to VCC and N1 is off. During the evaluate stage (e.g. CLK=HIGH), N1 is on and P1 is off such that node X is pulled low or remains at its pre-charge voltage level depending on the comparison of the bit lines. For each pair of bit lines, the dynamic comparator includes a comparison sub-circuit coupled between devices N1 and P1 which, during the evaluate stage, either pulls node X towards ground when the bits are different or which maintains the pre-charge voltage at node X when the bits are the same.

Referring to FIG. 1, each comparison sub-circuit compares two bit line pairs (e.g. $a_1$ and $b_1$). Each sub-circuit has two parallel branches B1 and B2—each branch including two series coupled devices. Ideally, in operation, if $a_n \neq b_n$ then both of the devices in one of the branches will be on while both of the devices in the other of the branches will be off. As a result, a path between node X and ground is created such that when device N1 is on during the evaluate stage, node X is pulled to ground.

For instance, if $a_1$=HIGH and $b_1$=LOW, then N2 and N3 will both be on while devices N4 and N5 are both off, thereby forming a path from node X to ground during the evaluate stage through devices N2 and N3. On the other hand if $a_1$=$b_1$, then at least one device is off in each branch and no path is created between node X and ground during the evaluate stage such that node X remains at its pre-charge state. For instance if $a_1$=$b_1$=HIGH then device N2 is on and device N3 is off while device N4 is off and device N5 is on.

The problem that occurs in this type of circuit is that during the pre-charge phase, node X begins to charge to VCC and, at the same time, the A and B bus input signals are also being set-up. As a result, during the pre-charge phase some of the devices that are directly connected to node X will be switched "on" as node X is being pre-charged. For instance, if $a_1$=$b_1$=HIGH is applied to the gates of devices N2–N4 while node X is pre-charging, device N2, which is connected directly to node X, will turn on during the pre-charge phase. As a result, the parasitic capacitance $C_1$ associated with node $n_1$ combines with the parasitic capacitance $C_x$ associated with node X causing an initial drop in voltage at node X during pre-charge. After this initial drop, however, since N1 is off and P1 is on, P1 continues to pre-charge node X to VCC. Unfortunately, the effect of the initial drop is that it takes longer to pre-charge node X. In addition, in the case in which more than one pair of bits matches, more of the parasitic capacitances $C_2$, $C_3$, ... $C_n$ combine and cause a proportional drop in voltage on node X during pre-charge.

The present invention describes a dynamic comparator having improved pre-charge and set-up times that avoids the effects of unwanted parasitic capacitances.

SUMMARY OF THE INVENTION

The present invention is a dynamic comparator which includes logic gates for keeping certain devices that are directly connected to the pre-charge node of the comparator turned off during a pre-charge phase such that pre-charge and set-up times are improved.

In one embodiment, the dynamic comparator includes a first device coupled between VCC and the output node of the comparator and having its gate coupled to a clock signal wherein when the clock is in a pre-charge phase, the output node is pre-charged to VCC and when the clock is in its evaluate phase, the first device is off. The comparator also includes a second device coupled between a second node and ground and having its gate coupled to the clock signal such that it is off during the pre-charge clock phase and it is on during the evaluate clock phase.

Coupled between the output node and the second node are a plurality of comparison sub-circuits—one per bit comparison—each including two parallel branches of serially connected devices. In accordance with an embodiment of the present invention, each device within the comparison sub-circuits that is directly connected to the output node of the dynamic comparator (i.e. top row of devices) has its gate coupled to a logic gate. The inputs of the logic gate are cross-coupled to input bit line signals such that when a match occurs during pre-charge between bits the logic gates hold all top row devices off. As a result, the pre-charging of node X is unaffected by undesirable parasitic capacitances contributed by the sub-circuit devices and pre-charge and set-up times can be minimized.

BRIEF DESCRIPTION OF THE DRAWINGS

FIG. 1 shows a prior art dynamic comparator

FIG. 2 shows one embodiment of the dynamic comparator of the present invention.

FIG. 3 shows associated timing diagrams for the dynamic comparator of the present invention.

FIG. 4 shows associated timing diagrams for the prior art dynamic comparator.

DESCRIPTION OF PREFERRED EMBODIMENTS

FIG. 2 shows one embodiment of the dynamic comparator of the present invention for comparing a first multiple bit bus A having bit line signals $a_1$–$a_n$ and a second multiple bit bus B having bit line signals $b_1$–$b_n$. The comparator performs a bit-by-bit parallel comparison. For instance $a_1$ and $b_1$ are compared, $a_2$ and $b_2$ are compared.

The dynamic comparator includes PMOS device P10 coupled between VCC and node X and NMOS device N11 coupled between VDD and node Z. Each of devices P10 and N11 have their gates coupled to the clock signal. The clock signal has two phases, a pre-charge/set-up phase and an evaluate phase. During the pre-charge/set-up phase, P10 is on and N11 is off, and node X is charged to VCC. Furthermore, during the pre-charge phase, the input signals $a_1$–$a_n$ and $b_1$–$b_n$ are set to their intended comparison levels. During the evaluate phase, P10 is off and N11 is on, and the state of node X is dependent on the results of the comparison sub-circuits 1-n (i.e. whether there is a direct path between node X and ground). Each sub-circuit 1-n includes two parallel branches of series coupled devices. Specifically, sub-circuit 1 includes a first branch B1 having series coupled devices N12 and N13 and a second branch B2 having series coupled devices N14 and N15 and sub-circuit n has branch B1(n) having devices N12(n) and N13(n) and branch B2(n) having devices N14(n) and N15(n).

Devices N12, N14 . . . N12(n), and N14(n) represent the devices that are directly connected to node X and that when switched on during pre-charge can cause the pre-charge voltage to drop as described with respect to the prior art comparator shown in FIG. 1 and further described below. In order to overcome this problem, the dynamic comparator of the present invention couples one of NOR gates 16 and 17 to each of the gates of devices N12, N14, . . . N12(n), N14(n) and cross couples the inputs to the NOR gates such that when $a_1$=$b_1$ . . . $a_n$=$b_n$, then the gate output voltages Vg and Vg' will both be LOW and devices N12 . . . N12(n) and N14 . . . N14(n) will be off. As a result, during the pre-charge phase, when the bus signals $a_1$–$a_n$ and $b_1$–$b_n$ are applied and $a_n$=$b_n$, all of the top row devices (i.e. N12, N14, . . . N12(n), and N14(n)) will be switched off and node X is unaffected by the parasitic capacitances associated with these devices.

The static operation of the circuit (i.e. ignoring timing phases) is as follows. In the case in which $a_n$≠$b_n$, (e.g. $a_n$=LOW and $b_n$=HIGH or $a_n$=HIGH and $b_n$=LOW), one of the branches will have both devices turned on providing a path between node X and ground during the evaluate stage (i.e. when device N11 is on). For instance, when an=HIGH and bn=LOW then the output of NOR gate 16 is low while the output of NOR gate 17 is HIGH. As a result, devices N14 and N15 have a high voltage applied to their gates, providing a path between node X and ground during the evaluate phase. This causes node X to discharge to ground causing the output of the inverter to go HIGH.

In the case in which $a_n$=$b_n$, no path is provided from node X to ground and both of devices N12 and N14 are turned off. For instance, when $a_n$=$b_n$=HIGH or when $a_n$=$b_n$=LOW the output of NOR gates 16 and 17 are both LOW. As a result, both of devices N14 and N15 have a low voltage applied to their gates and are turned off. In this case, node X remains pre-charged and the output of the inverter remains LOW.

FIG. 3 shows the voltage and timing diagrams for the dynamic comparator of the present invention. The timing diagrams assume that in the previous evaluation phase node X was at a low voltage (i.e. FIG. 3 shows the voltage on node X as a low voltage at time T1). After time T1, node X begins to charge to VCC and the input signals $a_n$ and $b_n$ are not yet set. At time T2, $a_n$ and $b_n$ are set HIGH and the output voltage Vg and Vg' of NOR gates 16 and 17 go LOW, thereby turning devices N12 and N14 off. As a result, node X voltage continues to charge to VCC and is unaffected by the parasitic capacitances $C_1$–$C_n$. As a result, the pre-charge phase time can be minimized since pre-charging is unaffected by the parasitic capacitances $C_1$–$C_n$.

FIG. 4 shows the voltage and timing diagrams for the prior art dynamic comparator shown in FIG. 1. The timing diagram assumes that in the previous evaluation phase node X was at a low voltage (i.e. FIG. 4 shows the voltage on node X as a low voltage at time T1). After time T1, node X begins to charge to VCC and the input signals $a_n$ and $b_n$ are not yet set. At time T2, $a_n$ and $b_n$ are set HIGH, such that device N2(n) is on and the node capacitance $C_n$ combines with $C_x$ causing the voltage on node X to drop. Since the node X voltage drops, it will require a longer time for node X to reach VCC than the dynamic comparator of the present invention.

It should be understood that although the example shown above shows only one matching bit pair more than one bit pair can be matching in which case the devices coupled to node X will also be turned off in accordance to the operation of the dynamic comparator of the present invention.

It should also be understood that NOR gates 16 and 17 may be replaced with any equivalent logic circuit performing the same function as NOR gates 16 and 17.

In the preceding description, specific details are set forth, such as the type of logic gate used, particular input conditions, and PMOS or NMOS device types in order to provide a thorough understanding of the present invention. It will be apparent, however, to one skilled in the art that these specific details need not be employed to practice the present invention. In other instances, well-known device theory has not been described in detail in order to avoid unnecessarily obscuring the present invention.

Moreover, although the elements of the present invention have been described in conjunction with a certain embodiment, it is appreciated that the invention can be implemented in a variety of other ways. Consequently, it is to be understood that the particular embodiment shown and described by way of illustration is in no way intended to be considered limiting. Reference to the details of this embodiment is not intended to limit the scope of the claims which themselves recite only those features regarded as essential to the invention.

What is claimed is:

1. A dynamic comparator for comparing a first set of signals to a second set of signals comprising:

a clock signal having a pre-charge phase and a compare phase;

a first switching device coupled between a first working potential and a first node, said first switching device pre-charging said first node during said pre-charge phase and being off during said compare phase, said first node corresponding to the output of said comparator;

a second switching device coupled between a second node and a second working potential, said second switching device being off during said pre-charge phase and being on during said compare phase;

a plurality of comparing circuits for comparing one of said first set of signals to a corresponding one of said second set of signals each comparing circuit comprising:

a first branch coupled between said first and second nodes including third and fourth series coupled switching devices, said third device being coupled to said first node and said fourth device having its gate coupled to said one of said first set of signals;

a second branch coupled in parallel with said first branch including fifth and sixth series coupled switching devices, said fifth device being coupled to said first node and said sixth device having its gate coupled to the inverse of said one of said first set of signals;

a first logic gate coupled to the gate of said third device and responsive to said corresponding one of said second set of signals and said inverse of said one of said first set of signals wherein said third device is always off when said one of said first set of signals and said corresponding one of said second set of signals is the same;

a second logic gate coupled to the gate of said fifth device and responsive to said one of said first set of signals and the inverse of said corresponding one of said second set of signals wherein said fifth device is always off when said one of said first set of signals and said corresponding one of said second set of signals is the same.

2. The comparator as described in claim 1 wherein said first and second logic gates are a NOR gates.

3. The comparator as described in claim 1 wherein said first device is a PMOS device and said second, third, fourth, and fifth devices are NMOS devices.

4. The comparator as described in claim 1 wherein said one of said first set of signals and said corresponding one of said second set of signals are applied to said comparator during said pre-charge phase.

5. A method of minimizing pre-charge phase times in a dynamic comparator, said comparator comparing first and second bus signals, said comparator comprising an output node which is pre-charged during a pre-charge phase, said method comprising the steps of:

coupling logic gates to given switching devices of said comparator which are directly coupled to said output node; and controlling said logic gates so as to switch off said given devices when certain first and second input signals are applied during said pre-charge phases.

6. The method as described in claim 5 wherein each of said switching devices include a source, drain, and gate and said step of coupling said logic gates further comprises coupling NOR gate to each of said gates of said switching devices.

7. The method as described in claim 5 wherein said certain first and second input signals comprise first and second corresponding matched input signals which are being compared.

* * * * *